(12) United States Patent
Lin et al.

(10) Patent No.: US 10,871,719 B2
(45) Date of Patent: Dec. 22, 2020

(54) EUV METAL DROPLET CATCHERS

(71) Applicant: TAIWAN SEMICONDUCTOR MANUFACTURING CO., LTD., Hsinchu (TW)

(72) Inventors: Sheng-Ta Lin, Miaoli County (TW); Po-Chung Cheng, Chiayi County (TW); Li-Jui Chen, Hsinchu (TW); Shang-Chieh Chien, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/442,057

(22) Filed: Jun. 14, 2019

(65) Prior Publication Data
US 2020/0057389 A1 Feb. 20, 2020

Related U.S. Application Data

(60) Provisional application No. 62/719,344, filed on Aug. 17, 2018.

(51) Int. Cl.
*G03B 27/54* (2006.01)
*G03F 7/20* (2006.01)

(52) U.S. Cl.
CPC ...... *G03F 7/70716* (2013.01); *G03F 7/70033* (2013.01)

(58) Field of Classification Search
CPC . G03F 7/70033; G03F 7/70716; H05G 2/003; H05G 2/005; H05G 2/008; G21K 5/00
See application file for complete search history.

(56) References Cited

U.S. PATENT DOCUMENTS

| | | | |
|---|---|---|---|
| 8,796,666 B1 | 8/2014 | Huang et al. | |
| 8,901,523 B1 * | 12/2014 | Ershov | H01J 37/32477 250/504 R |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 2009/0272919 A1 * | 11/2009 | Abe | G03F 7/70033 250/504 R |
| 2010/0258748 A1 * | 10/2010 | Vaschenko | H05G 2/003 250/504 R |
| 2015/0338753 A1 * | 11/2015 | Riepen | G03F 7/70033 250/504 R |

* cited by examiner

*Primary Examiner* — Peter B Kim
(74) *Attorney, Agent, or Firm* — McDermott Will & Emery LLP

(57) ABSTRACT

A droplet catcher includes a tube main body and baffles arranged along a length direction of the tube main body.

20 Claims, 7 Drawing Sheets

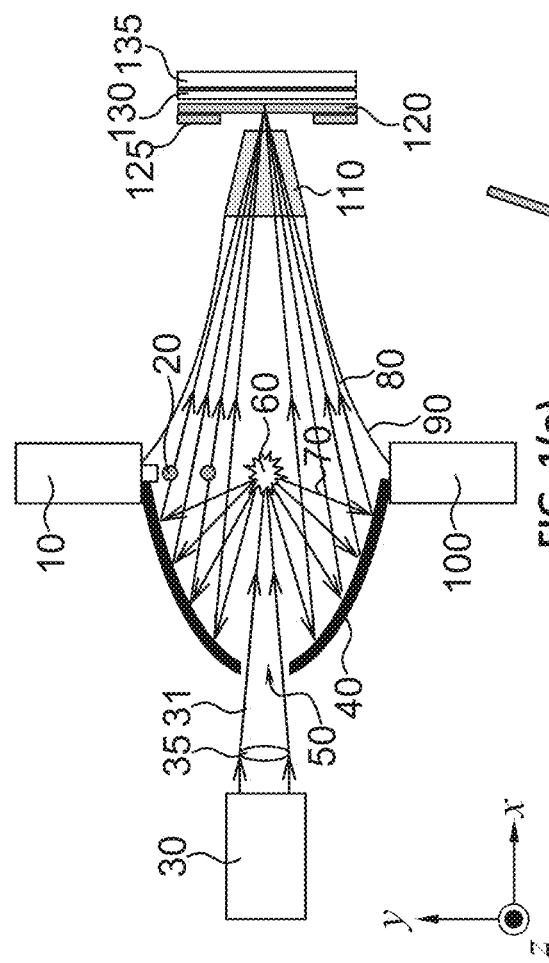
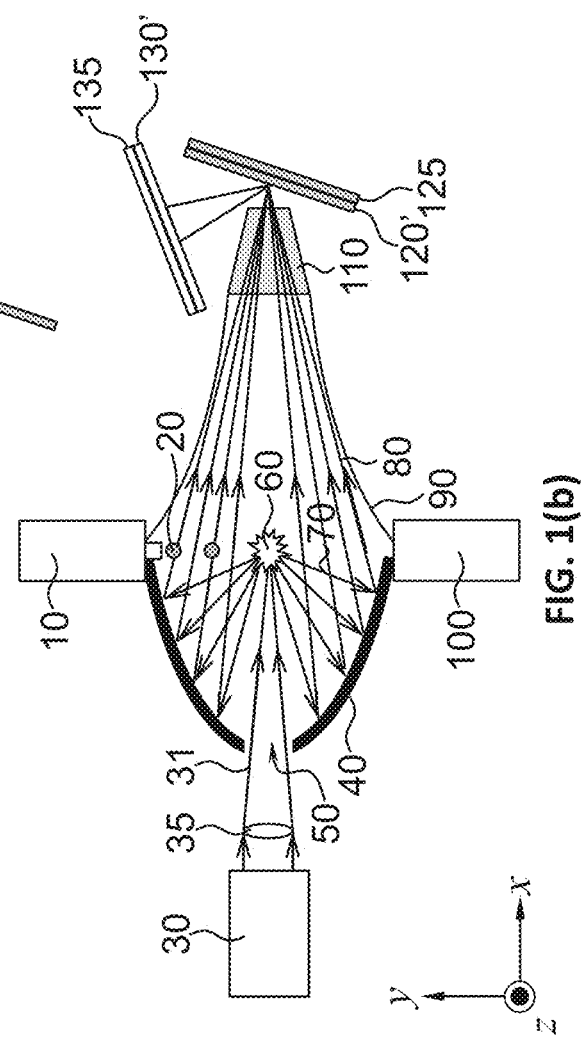
FIG. 1(a)
FIG. 1(b)

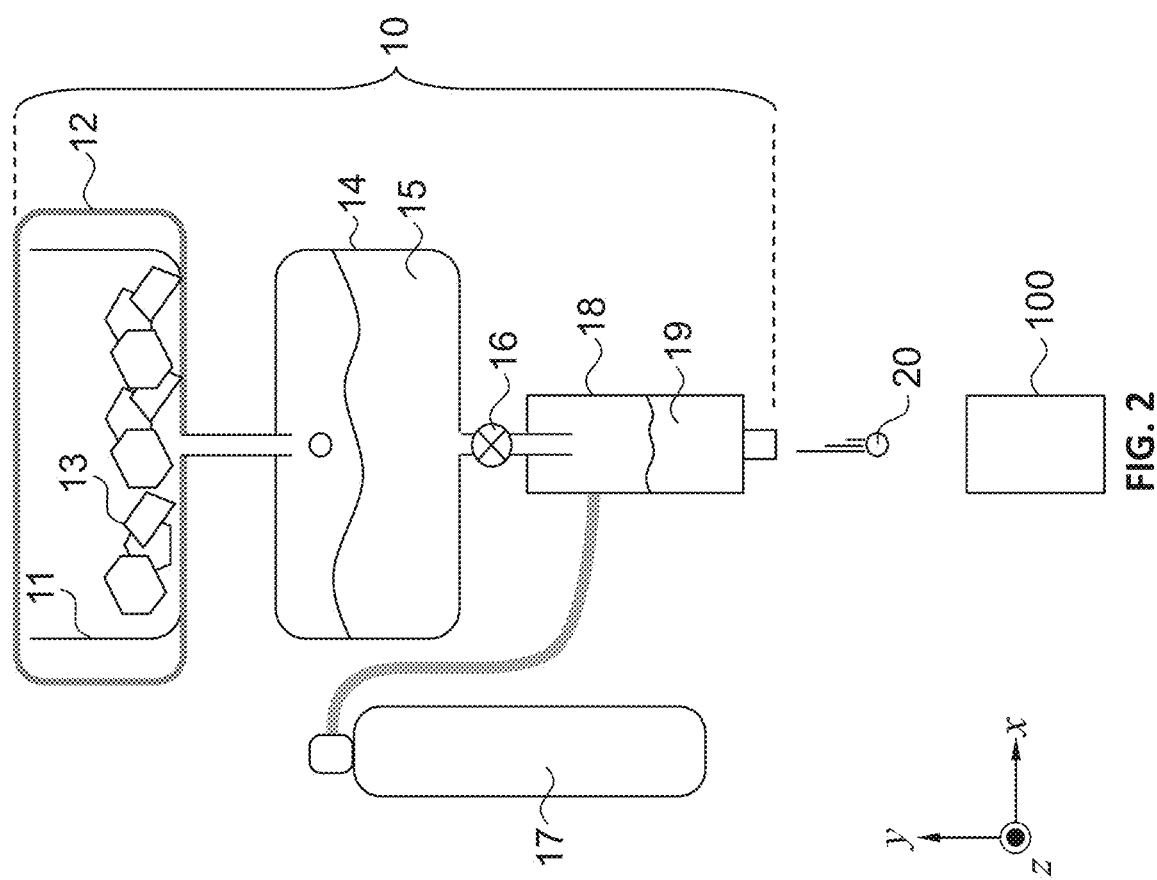

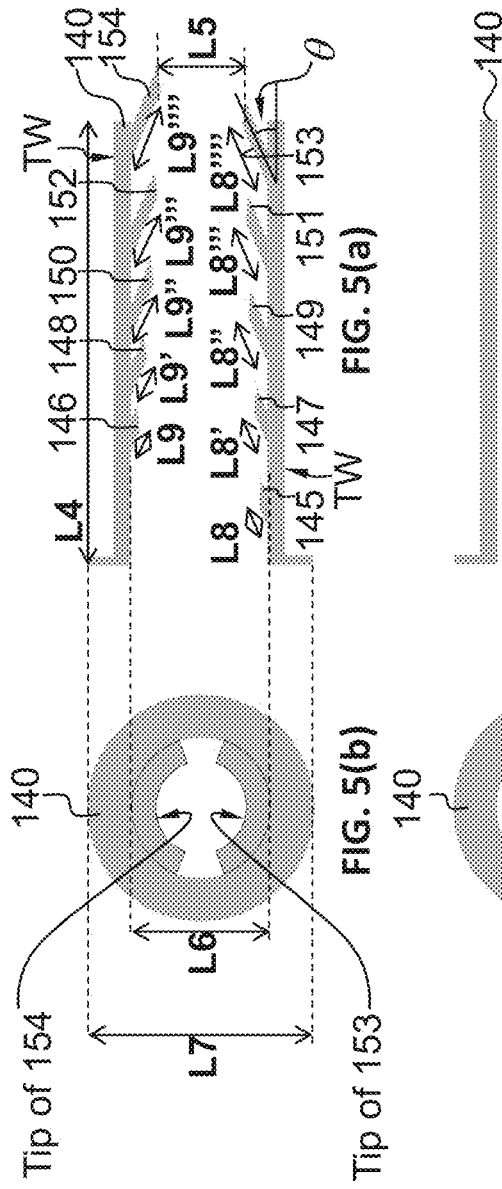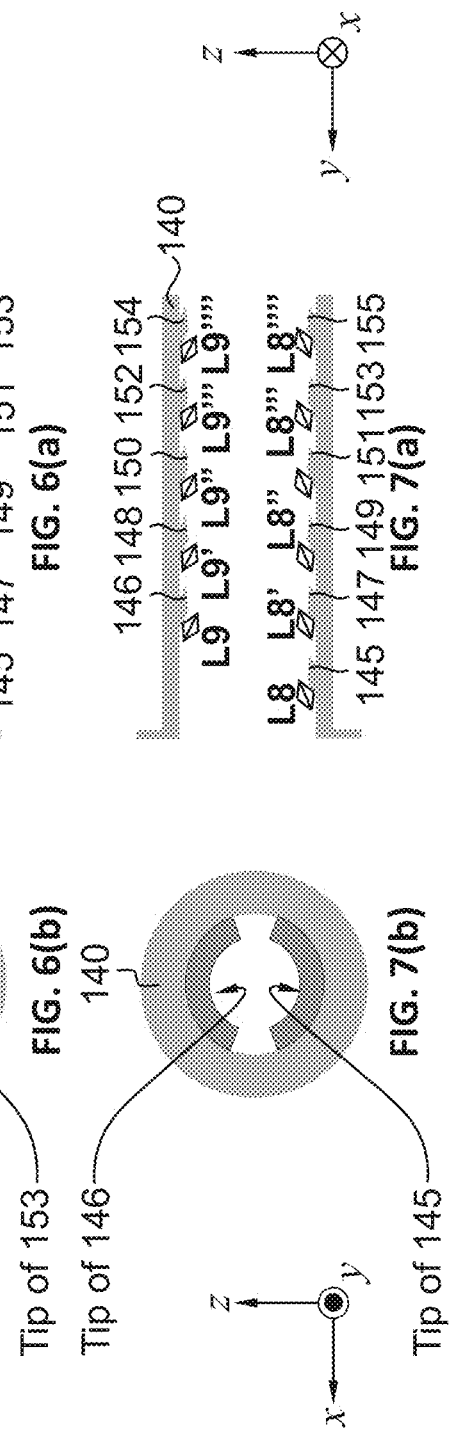

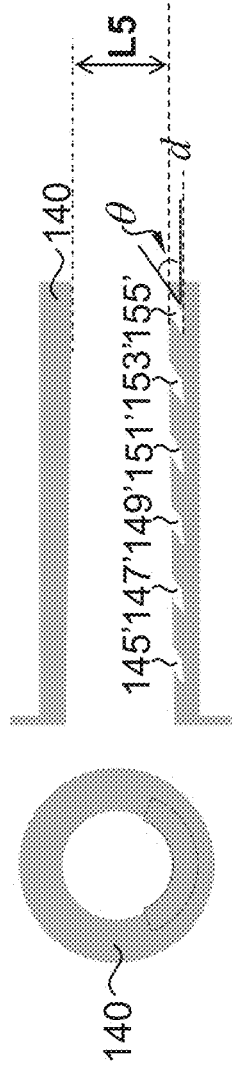
FIG. 8(a)
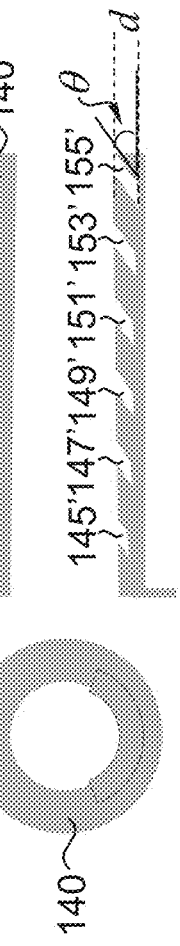
FIG. 9(a)
FIG. 10(a)
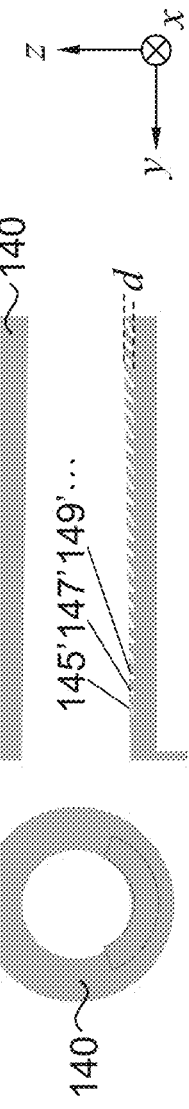
FIG. 11(a)
FIG. 8(b)
FIG. 9(b)
FIG. 10(b)
FIG. 11(b)

EUV METAL DROPLET CATCHERS

CROSS-REFERENCE TO RELATED APPLICATION

The present application claims priority to and incorporates by reference in its entirety U.S. Provisional Application 62/719,344 filed on Aug. 17, 2018.

BACKGROUND

As device size shrinks, it is necessary to create finer patterns. Extreme ultraviolet (EUV) photolithography can form finer patterns than ultraviolet photolithography. EUV photolithography relies on plasma formation to emit the EUV light rays. In EUV photolithography, the laser beam hits a first target (i.e. a metal droplet stream) to form plasma which emits EUV light rays which in turn are reflected off a collector mirror and directed toward a second target—the photosensitive coating coated substrate. Since the EUV light rays generated from the plasma travels in all directions, the EUV light rays travelling in a direction opposite to the path toward the target substrate would be wasted if not collected and re-directed towards the intended target. The collector mirror is thus required to collect and re-direct the EUV light rays toward the target substrate and focus the collected light rays to an intermediate focus (IF) for reflecting off a patterned mask or reticle onto a target substrate. The metal droplets are generated by a generator. After being hit by the laser for plasma formation, or after being missed by the laser, the metal droplets would be wasted if not collected for re-cycling. A metal catcher is installed to collect the metal droplets. The metal droplets which are collected by the open container of metal catcher would be evaporated or splashed backward in a direction opposite to the direction of the metal droplets entering the metal catcher. In this way, the chamber of the EUV system would be contaminated by the metal droplets, and the formation of the plasma would not be easily controlled if the back-splash of the metal droplets occurs. Therefore, there is a demand for a metal catcher that can efficiently collect the metal droplets after plasma formation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1(a) shows a schematic top cross-sectional view of a transmissive EUVL system having an EUV light source, a metal droplet generator, and a metal droplet catcher, according to an embodiment of the present disclosure.

FIG. 1(b) shows a schematic top cross-sectional view of a reflective EUVL system having an EUV light source, a metal droplet generator, and a metal droplet catcher, according to another embodiment of the present disclosure.

FIG. 2 shows a schematic view of a metal droplet generator, according to an embodiment of the present disclosure.

FIG. 5(a) shows a cross-sectional view of a baffle system, according to another embodiment of the present disclosure.

FIG. 5(b) shows a front view of the baffle system of FIG. 5(a).

FIG. 6(a) shows a cross-sectional view of a baffle system, according to an embodiment of the present disclosure.

FIG. 6(b) shows a front view of the baffle system of FIG. 6(a).

FIG. 7(a) shows a cross-sectional view of a baffle system, according to another embodiment of the present disclosure.

FIG. 7(b) shows a front view of the baffle system of FIG. 7(a).

FIG. 8(a) shows a cross-sectional view of a baffle system, according to another embodiment of the present disclosure.

FIG. 8(b) shows a front view of the baffle system of FIG. 8(a).

FIG. 9(a) shows a cross-sectional view of a baffle system, according to another embodiment of the present disclosure.

FIG. 9(b) shows a front view of the baffle system of FIG. 9(a).

FIG. 10(a) shows a cross-sectional view of a baffle system, according to another embodiment of the present disclosure.

FIG. 10(b) shows a front view of the baffle system of FIG. 10(a).

FIG. 11(a) shows a cross-sectional view of a baffle system, according to another embodiment of the present disclosure.

FIG. 11(b) shows a front view of the baffle system of FIG. 11(a).

DETAILED DESCRIPTION

Figure 3:
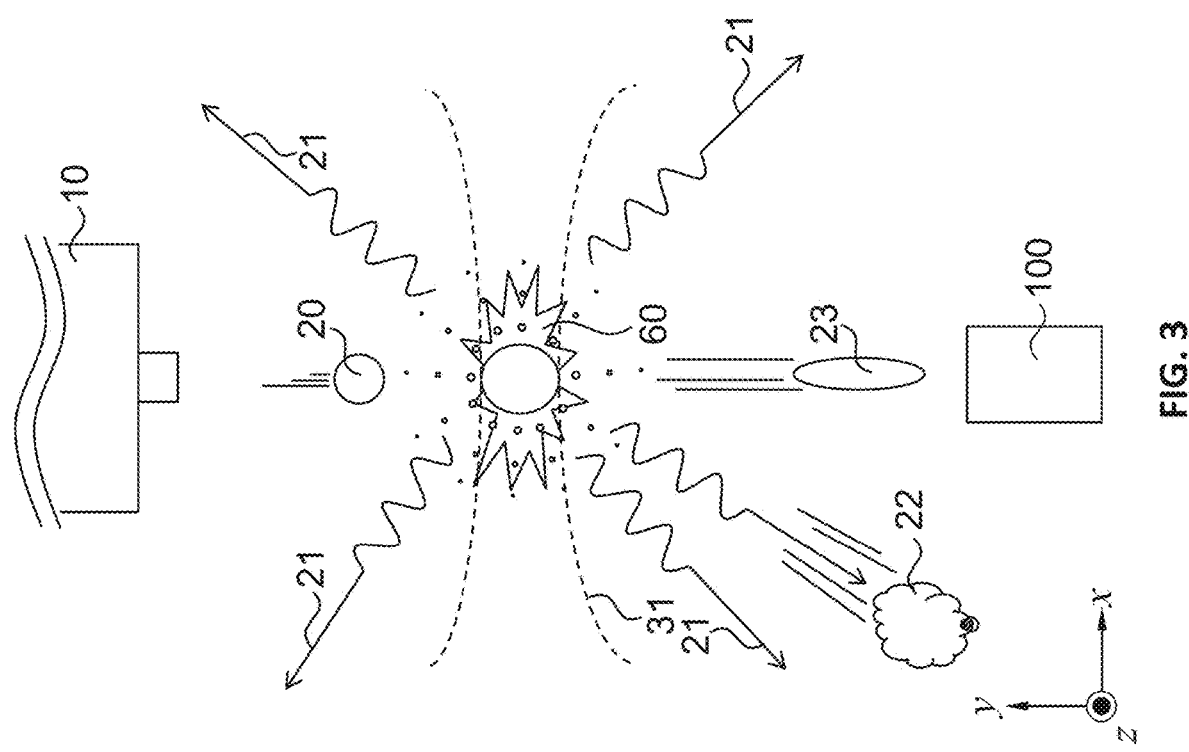
FIG. 3 shows a schematic view of plasma formation in a region between a metal droplet generator and a metal droplet catcher, according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

With the increasing trend of the Moore's law for decreasing the size of chip components and the demand of higher computing power chips for mobile electronic devices such as smart phones with computer functions, the search for a light source to achieve the size-shrinking demand of chip patterns has resulted in an extreme ultraviolet EUV photolithography technique that uses an EUV radiation source to emit an EUV light with a wavelength of 13.5 nm. Because this wavelength borders the x-ray radiation wavelength region, the EUV radiation source is also called a soft x-ray radiation source. The EUV light generated from plasma formation due to pulsed laser-metal interaction has a pulse duration of about 100 ns and the EUV energy fluence per pulse can be in a range from 100 W to 1 kW at the intermediate focus.

The EUV light rays are produced from a source such as laser-produced plasma source, discharge plasma source, or synchrotron radiation. In embodiments of the present disclosure, the laser-produced plasma source is presented. The laser-produced plasma is formed by interaction between laser and a liquid metal. The metal includes tin (Sn) and lithium (Li), in some embodiments of the present disclosure.

FIG. 1(a) shows a schematic cross-sectional view of an EUVL system having an EUV light source in an ideal operation situation. The EUVL system includes a laser generating system 30, a laser-focusing lens 35, an EUV collector mirror 40, a target delivery system or tin droplet ejection system 10, a drain or metal droplet catcher 100 for unreacted tin droplets 20, a vane portion 90, a cone portion 110, a patterned mask or reticle 120 held by a mask stage 125, and a target substrate 130 held by a substrate stage 135. The EUV collector mirror 40 is made of a multi-layered mirror including Mo/Si, La/B, La/B$_4$C, Ru/B$_4$C, Mo/B$_4$C, Al$_2$O$_3$/B$_4$C, W/C, Cr/C, and Cr/Sc with a capping layer including SiO$_2$, Ru, TiO$_2$, and ZrO$_2$, in some embodiments of the present disclosure. The diameter of the EUV collector mirror 40 can be about 330 mm to about 750 mm, etc. depending on the chamber size of the EUVL system. The cross-sectional shape of the collector mirror 40 is elliptical or parabolic, in some embodiments of the present disclosure.

The target delivery system or tin droplet ejection system 10 ejects tin droplets 20 toward the droplet catcher 100, forming a target stream of tin droplets 20. In the ideal operation situation of the EUVL system, a high-power and high-pulse-repetition-rate laser beam is emitted from a laser generating system 30 such as a gas discharge laser or a solid state laser. The emitted laser beam is focused through a focusing lens 35 forming a focused laser beam 31 which passes through an aperture 50 formed in an EUV collector mirror 40. The focused laser beam 31 is focused at an ignition site to form plasma 60 through laser-metal interaction between the laser beam 31 and the metal droplets 20 ejected from the ejection system 10. EUV light rays 70 are formed and emitted from the plasma 60 in all directions. The emitted EUV light rays 70 directed toward the EUV collector mirror 40 are reflected as EUV light rays 80 and pass through the portion 90 (vane portion) and the portion 110 (cone portion) to another focus (called 'intermediate focus') at which a patterned transmissive mask or reticle 120 is located. The transmissive mask 120 including a pattern having openings is located for the reflected laser beam to pass through the openings and reach the photo-sensitive coating on a target substrate 130 held by a substrate stage 135, facilitating the transmissive EUV photolithography processing of the semiconductor substrate for forming electronic device components or circuits on the semiconductor substrate. In industry, reflective EUV photolithography (FIG. 1(b)) is more common. In reflective EUV photolithography (FIG. 1(b)), a reflective patterned mask 120' or reticle (held by a mask stage 125) with reflective patterns is located at the second focus or intermediate focus to reflect the EUV light rays 80 off the reflective mask 120' in a patternwise manner toward the target substrate 130' held by a substrate stage 135 or through a series of optical components (not shown) to reach the target substrate 130' held by the substrate stage 135. In the transmissive and reflective embodiments shown in FIGS. 1(a) and 1(b), the metal droplets 20 such as tin droplets are collected by the tin catcher or drain or metal droplet catcher 100.

FIG. 2 shows an apparatus or a target delivery system to form liquid metal droplets for the interaction between laser and the droplets to form a laser-produced plasma source for emission of EUV rays. As shown in FIG. 2, the apparatus includes a container 11 containing solid tin 13. The container 11 is made of a suitable heat-conductive material that does not react with the tin 13, in some embodiments of the present disclosure. The container 11 is enclosed in an enclosure 12 for maintaining a desired atmosphere with a specific gas pressure inside, in some embodiments of the present disclosure. In other embodiments of the present disclosure, the enclosure 12 maintains a desired level of vacuum inside the container 11. Also, the enclosure 12 includes a heater (not shown) to provide thermal energy to the tin 13 for phase transition to the liquid phase. The heater can be any heater, such as a resistive coil heater, gas heater, radiative heater, or magnetic heater, in some embodiments of the present disclosure. The phase-transformed (liquid) tin 15 passes through a delivery tube to a container 14 that collects the liquid tin 15. A valve 16 is included in the target delivery system to control the amount of the liquid tin 15 delivered from the delivery tube to enter the injection system 18. The valve 16 can be any valve such as a solenoid valve, robotic valve, or even manual valve with high precision control, in some embodiments of the present disclosure. The valve 16 is connected to a controller (not shown) to control the valve 16 during the EUV generation process, in some embodiments of the present disclosure. The injection system 18 is connected with a gas cylinder 17 through a gas tube. The gas cylinder 17 stores an inert gas, such as He or nitrogen $N_2$, in some embodiments of the present disclosure. The gas entering the injection system 18 is pressurized to eject the liquid tin 19 to form an ejected tin droplet 20 in a droplet shape for forming plasma 60 (FIG. 3) by laser-metal interaction in some embodiments of the present disclosure. The tin droplet 20 also includes solid particles inside the liquid droplet in some embodiments. The frequency of ejection of the tin droplets 20 is controlled by the controller controlling the injection system 18 or by another controller so as to synchronize with the laser pulse generated by a pulsed laser source, in some embodiments of the present disclosure. The speed of the ejected tin droplet 20 is about 2 ms$^{-1}$ in some embodiments of the present disclosure.

FIG. 3 shows a schematic view demonstrating the plasma formation process through laser-metal interaction between a high-power and high-pulse-repetition-rate laser beam and a metal droplet. In FIG. 3, the ejected tin droplet 20, from ejection system 10, passes to a desired spot (also called 'ignition site', 'initiation site', or 'site of fireball') where it interacts with the laser to form plasma. The ignition site is at a focus of the high-power and high-pulse-repetition-rate pulsed laser beam 31. The laser beam 31 may be generated by a gas laser including an excimer gas discharge laser, $CO_2$ laser, helium-neon laser, nitrogen laser, transversely excited atmospheric (TEA) laser, argon ion laser, copper vapor laser, KrF laser or ArF laser; or a solid state laser including Nd:YAG laser, Nd:glass laser, ytterbium-doped glasses or ceramics laser, or a ruby laser. The laser beam 31 interacts with the ejected tin droplet 20 at the ignition site in a space of the chamber of the EUVL system to form plasma 60 which emits EUV light rays 21 in all directions. During this laser-metal interaction, a tin droplet 20 could be missed or not interact sufficiently with the laser beam 31, thereby passing to a position below the ignition site in FIG. 3, forming tin debris droplet 23. Also, some tin leftover from the plasma formation process can be pushed by the emitted photons and become debris 22. The debris droplet 23 and debris 22 can accumulate on the surface of the EUV collector mirror 40 (FIGS. 1(a) and 1(b)), deteriorating the reflective quality of the EUV collector mirror 40. Debris and droplet contaminated collector mirrors need to be more frequently cleaned and/or replaced thereby increasing the manufacturing cost of replacement of the expensive EUV collector mirror 40, and more importantly, increasing manufacturing time and cost for the replacement. Replacement of the EUV collector mirror may require up to a week. Therefore, there is a demand for an improved method of cleaning the EUV collector contaminated by the debris droplet 23 and the debris 22. A metal droplet catcher 100 can collect the debris droplet 23, according to some embodiments of the present disclosure. The metal droplets 20 entering the metal droplet catcher 100 has a high speed of e.g. 2 $ms^{-1}$ and would cause the problem of splash of the molten metal 200 (FIG. 4(a)) stored in the metal droplet catcher 100. The splashed molten metal 200 would jump out of the metal droplet catcher 100 and hit and contaminate the EUV chamber or other important components such as the collector mirror 40 to reflect the EUV light, resulting in low-quality EUV light for EUV photolithography or halting the entire EUV process. Therefore, a metal droplet catcher that can prevent the problem of splash of the molten metal 200 is demanded.

Figure 4A:
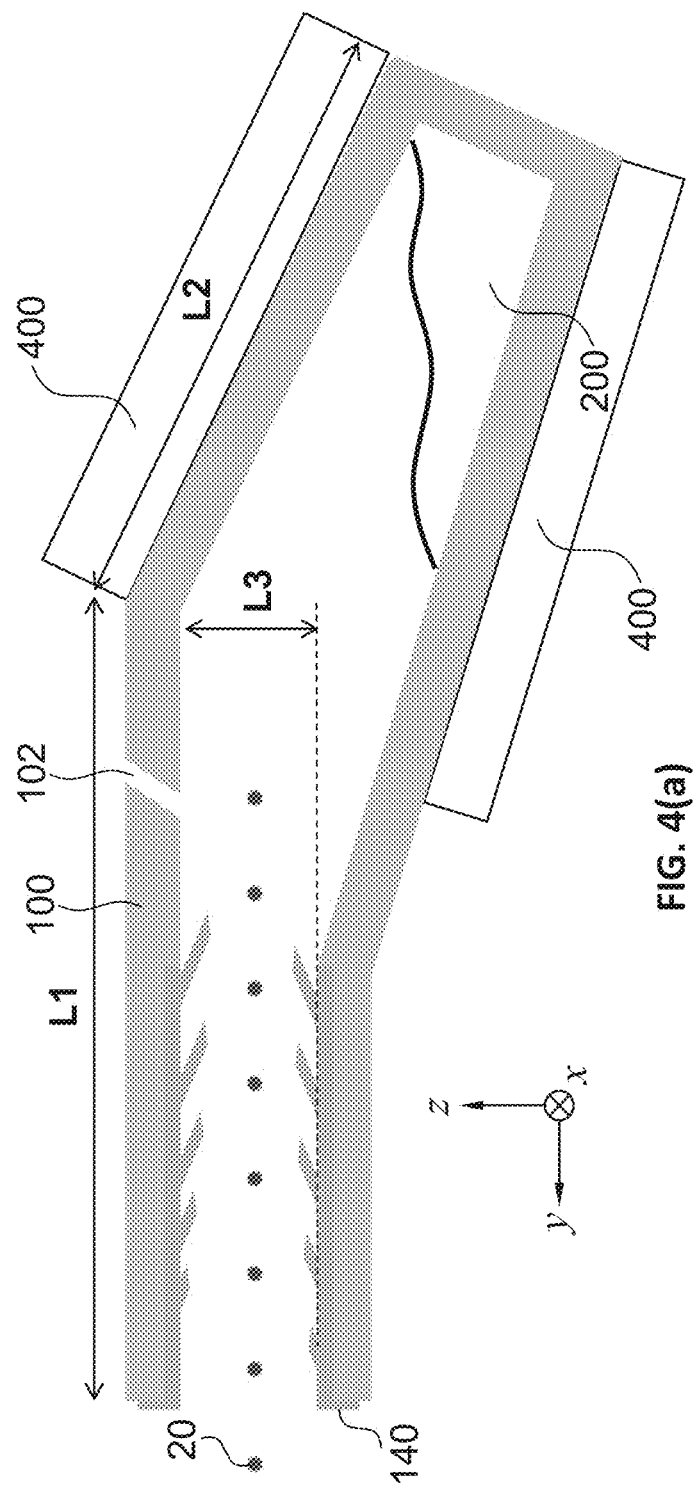
FIG. 4(a) shows a cross-sectional view of a metal droplet catcher, according to an embodiment of the present disclosure.

FIG. 4(a) shows a cross-sectional view of a metal droplet catcher 100 with closed bottom end to catch the metal droplets 20 or not-hit metal debris droplets 23 and store as molten metal 200, according to an embodiment of the present disclosure. In FIG. 4(a), the metal droplet catcher 100 includes a baffle system 140 positioned at the opening of the metal droplet catcher 100 facing and catching the incoming stream of the metal droplet 20, according to some embodiments of the present disclosure. The baffle system 140 covers the inner wall of the metal droplet catcher 100, according to some embodiments of the present disclosure. Also, in some embodiments, the baffle system 140 covers a partial region of the front surface of the opening of the metal droplet catcher 100. The coverage of the metal droplet catcher 100 by the baffle system 140 depends on the desired efficiency of the impedance of the splash of the molten metal 200 and the instrumental conditions inside the chamber of the EUVL system having the metal droplet catcher 100.

The metal droplet catcher 100 has a tube shape in some embodiments. The metal droplet catcher 100 has a dimension of a front tube top length of L1 and an end portion for collecting and storing the metal droplets 20 as molten metal 200. The end portion has a top depth of L2. The diameter L3 is a dimension of the front tube portion of the metal droplet catcher 100 including the baffle system 140. The relationship between L1, L2, and L3 can be 2×, 0.75×, and 0.25× where x is a number depending on the size of the EUV chamber, respectively, in some embodiments of the present disclosure. The relationship between L1, L2, and L3 can be designed to facilitate the desired efficiency of the impedance of the splashed metal from the collected molten metal 200. FIG. 4(a) shows that the incoming metal droplets 20 face the baffle system 140 first before entering the other portions of the metal droplet catcher 100. FIG. 4(a) shows that the metal droplets 20 pass through the space between each of the baffles of the baffle system 140. Then, the metal droplets 20 enter the rear portion of the metal droplet catcher 100 and become molten metal 200 stored in the metal droplet catcher 100. FIG. 4(a) shows that the metal droplet catcher 100 does not have an open bottom end and the collected molten metal 200 would be taken away from the EUVL system by removing the metal droplet catcher 100 from the EUVL system. This closed-end design of the metal droplet catcher 100 in FIG. 4(a) has an advantage that the contamination due to increase of component parts can be reduced, and the quality of the EUV light produced in the chamber of the EUVL system is relatively high for patterning semiconductor substrates, according to some embodiments of the present disclosure. During this passage, the baffles of the baffle system 140 can apply an effect to impede the flow of the splashed metal from the closed-bottom of the metal droplet catcher 100 and at the same time allow the flow of the metal droplets 20 into the metal droplet catcher 100.

Also, in FIG. 4(a), the metal droplet catcher 100 has a bent shape including two portions, i.e. an opening portion for including the baffle system 140 and a rear portion for collecting the metal droplets 20. This bent shape further impedes the outgoing flow of the splashed molten metal 200, according to some embodiments of the present disclosure. In other embodiments the portions having L1 and L2 can be a straight continuous item without a bent (not shown). In other embodiments, the metal droplet catcher 100 including the portions having L1 and L2 can have a twisted structure to impede the outgoing flow of the collected molten metal 200. In some embodiments, a vent 102 is provided at the droplet catcher 100 to facilitate droplet collection. In some embodiments, a pumping system is coupled to the vent 102 to make a gas flow to outside the droplet catcher 100.

Figure 4B:
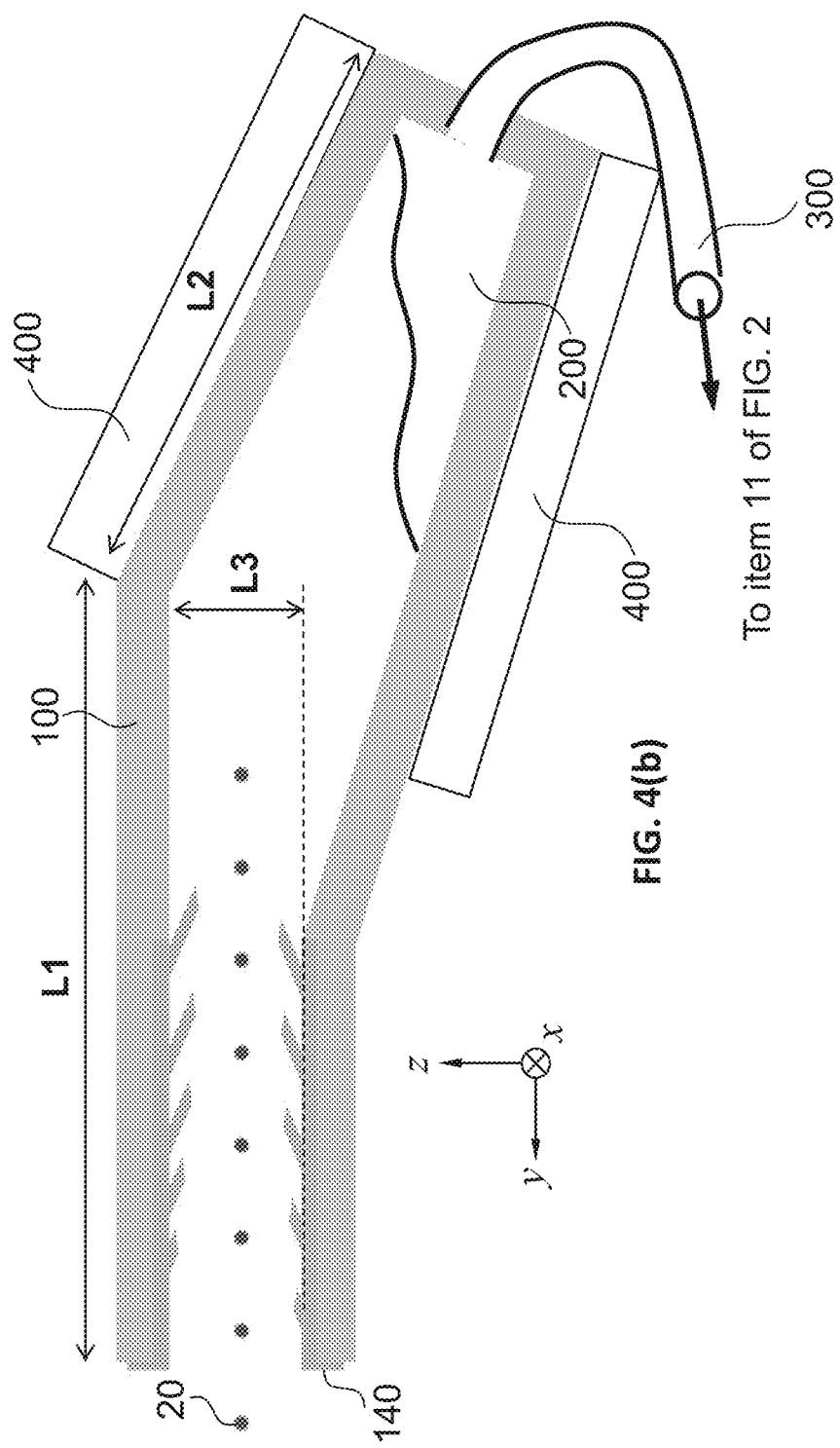
FIG. 4(b) shows a cross-sectional view of a metal droplet catcher, according to another embodiment of the present disclosure.

FIG. 4(b) shows a cross-sectional view of a metal droplet catcher 100 with an open bottom end to allow the collected molten metal 200 to flow through a tube 300 to other parts of the EUVL system, for example, to the container 11 for recycled usage of the metal droplets without opening the chamber of the EUVL system, according to an embodiment of the present disclosure. In FIG. 4(b), the metal droplet catcher 100 includes a baffle system 140 positioned at the opening of the metal droplet catcher 100 facing and catching the incoming stream of the metal droplet 20, according to some embodiments of the present disclosure. The baffle system 140 covers the inner wall of the metal droplet catcher 100, according to some embodiments of the present disclosure. Also, in some embodiments, the baffle system 140 covers a partial region of the front surface of the opening of the metal droplet catcher 100. The coverage of the metal droplet catcher 100 by the baffle system 140 depends on the desired efficiency of the impedance of the splashed molten metal 200 and the instrumental conditions inside the chamber of the EUVL system having the metal droplet catcher 100.

The metal droplet catcher 100 has a dimension of a front tube top length of L1 and a portion for collecting and containing the molten metal 200 and having a top depth of L2. The diameter L3 is a dimension of the front tube portion of the metal droplet catcher including the baffle system 140. The relationship between L1, L2, and L3 can be 2x, 0.75x, and 0.25x where x is a number depending on the size of the EUV chamber, respectively, in some embodiments of the present disclosure. The relationship between L1, L2, and L3 can be designed to facilitate the desired efficiency of the impedance of the splashed molten metal 200. FIG. 4(b) shows that the incoming metal droplets 20 face the baffle system 140 first before entering the other portions of the metal droplet catcher 100. FIG. 4(b) shows that the metal droplets 20 pass through the space between each of the baffles of the baffle system 140. Then, the metal droplets 20 enter the metal droplet collecting container and become collected molten metal 200. FIG. 4(b) shows that the metal droplet catcher 100 has an open bottom end and the collected molten metal 200 would be taken away from the EUVL system through the tube 300 without opening the chamber of the EUVL system. This open-end design of the metal droplet catcher 100 in FIG. 4(b) has an advantage that the time spent on removing the metal droplet catcher 100 from the EUVL system can be reduced or eliminated, and the production efficiency of the EUVL system can be increased, according to some embodiments of the present disclosure. Also, since the collected molten metal 200 are not constantly contained within the metal droplet catcher 100, the chance of splash of the collected molten metal 200 is reduced and the baffle system 140 can be designed to enhance the incoming flow of the metal droplets 20, according to some embodiments of the present disclosure. During this passage, the baffles of the baffle system 140 can apply an effect to impede the flow of the splashed molten metal 200 from the open-bottom of the metal droplet catcher 100 and at the same time facilitates the flow of the metal droplets 20 into the metal droplet catcher 100.

Also, in FIG. 4(b), the metal droplet catcher 100 has a bent shape including two portions, i.e. an opening portion for including the baffle system 140 and a rear portion for temporarily collecting the molten metal 200 before leading the molten metal 200 to the tube 300. This bent shape further impedes the outgoing flow of the splashed molten metal 200, according to some embodiments of the present disclosure. In other embodiments the portions having L1 and L2 can be a straight continuous item without a bent (not shown). In other embodiments, the metal droplet catcher 100 including the portions having L1 and L2 can have a twisted structure to impede the outgoing flow of the collected molten metal 200.

FIG. 5(a) shows the baffle system 140 having lower baffles 145, 147, 149, 151 and 153 and upper baffles 146, 148, 150, 152 and 154. The baffles 145, 146, 147, 148, 149, 150, 151, 152, 153, and 154 are arranged along a length direction (Y direction in FIGS. 4(a) and 4(b)) of the metal droplet catcher 100. The baffle system 140 has a tube length L4 and a distance of L5 between the tips of the longest upper baffle 154 and the longest lower baffles 153. In some embodiments, L4 and L5 are x and 0.125x, respectively, where x is a positive number and is the same as the above mentioned x. Each of the baffles 145, 146, 147, 148, 149, 150, 151, 152, 153, and 154 extends in an inclined direction toward a deeper region of the metal droplet catcher 100 (not shown), making an acute angle θ (in a range of 5 degrees to 85 degrees) with the extension direction of the tube wall TW of the baffle system 140, in some embodiments of the present disclosure. The baffles 145, 147, 149, 151 and 153 have lengths L8, L8', L8", L8''', and L8'''', respectively and the baffles 146, 148, 150, 152, and 154 have lengths L9, L9', L9", L9''', and L9'''', respectively. In FIG. 5(a), the upper baffles 146, 148, 150, 152, and 154 have ascendingly increasing lengths with the baffle 154 being the longest one, i.e. L9<L9'<L9"<L9'''<L9'''', in some embodiments of the present disclosure. Also, in FIG. 5(a), the lower baffles 145, 147, 149, 151, and 153 have ascendingly increasing lengths with the baffle 153 being the longest one, i.e. L8<L8'<L8"<L8'''<L8'''', in some embodiments of the present disclosure. In this way, the first baffle 145 facing and catching the droplet 20 has the smallest length and does not apply the largest area to impede the flow of the droplet 20. Also, the largest baffles 154 and 153 are the ones closest to the deeper region of the metal droplet catcher 100, providing an efficient way to impede splash or upstream of collected molten metal 200. In some embodiments, the number of lower baffles can be 5, i.e. 145, 147, 149, 151, and 153, and the number of lower baffles can be any number as long as the number of lower baffles facilitate to impede the upstream and splash of molten metal 200, and is not limited to the configuration of FIG. 5(a). In some embodiments, the number of upper baffles can be 5, i.e. 146, 148, 150, 152, and 154, and the number of upper baffles can be any number as long as the number of upper baffles facilitate to impede the upstream and splash of molten metal 200, and is not limited to the configuration of FIG. 5(a). In some embodiments, the number of lower baffles is different from that of the upper baffles. In some embodiments, the number of lower baffles is greater than that of the upper baffles.

FIG. 5(b) shows the front view of the baffle system 140 when viewing from Y direction. FIG. 5(b) shows the outer diameter L7 of the tube of the baffle system 140 and the inner diameter L6 of a circle of the contact surface between the tube of the baffle system 140 and the baffles 145, 146, 147, 148, 149, 150, 151, 152, 153, and 154. In some embodiments, L6 and L7 are 0.25x and 0.5x, respectively, and x is a positive number. FIG. 5(b) shows that the tip of the largest lower baffle 153 and the tip of the largest upper baffle 154 as seen from the front view of the baffle system 140, however, they are not the first ones catching the incoming liquid droplets 20 and would not apply a strong impedance to the incoming flow of the liquid droplets 20. In FIG. 5(b), the baffles e.g. 154 and 153 show a shape having same thickness from the left end to the right end, in some embodiments of the present disclosure. In other embodiments, in the front view of the baffle system 140, the baffles can have a crescent shape (not shown) having minimum thickness at both left and right ends, and maximum thickness at the central region. In other embodiments, in the front view of the baffle system 140, the baffles can have a shape of a semicircle without completely blocking the entrance of the liquid droplets 20. In FIGS. 5(a) and 5(b), the surface of the baffles of the baffle system 140 are smoothened for the collected molten metal 200 to flow back to the bottom of the metal droplet catcher 100, in some embodiments of the present disclosure. In other embodiments, the surface of the baffles of the baffle system 140 is made to have a certain roughness so as to catch the upstream of the molten metal 200. In some embodiments, a smoothened surface has a roughness Ra less than 10 μm, and in other embodiments, a smoothened surface has a roughness Ra less than 1 μm.

FIG. 6(a) shows a baffle system 140 having no upper baffles and having only lower baffles 145, 147, 149, 151, and 153. The baffles 145, 147, 149, 151, and 153 are arranged along a length direction (Y direction in FIGS. 4(a) and 4(b)) of the metal droplet catcher 100. The baffle system 140 has a tube length L4 the same as that in FIG. 5(a) and the corresponding distance of L5 is now defined between the tip of the longest lower baffle 153 and the upper tube inner wall TW. Each of the baffles 145, 147, 149, 151, and 153 extends in an inclined direction toward a deeper region of the metal droplet catcher 100 (not shown), making an angle θ(in a range of 5 degrees to 85 degrees) the same as that in FIG. 5(a) with the extension direction of the tube wall TW of the baffle system 140, in some embodiments of the present disclosure. The baffles 145, 147, 149, 151, and 153 have lengths L8, L8', L8", L8''', and L8'''', respectively. In FIG. 6(a), the upper inner tube wall TW can be smoothened to allow the flow of liquid droplets 20 into the tube and the deeper region of the metal droplet catcher 100 so as to become the collected molten metal 200. In FIG. 5(a), the lower baffles 145, 147, 149, 151, and 153 have ascendingly increasing lengths, by for example 10-30%, with the baffle 153 being the longest one, i.e. L8<L8'<L8"<L8'''<L8'''', in some embodiments of the present disclosure. In this way, the first baffle 145 facing and catching the droplet 20 has the smallest length and does not apply the largest area to impede the flow of the droplet 20. Also, the largest baffle 153 is the one closest to the deeper region of the metal droplet catcher 100, providing an efficient way to impede splash or upstream of collected molten metal 200 when hit by the droplets 20. In some embodiments, the number of lower baffles can be 5, i.e. 145, 147, 149, 151, and 153, and the number of baffles can be any number as long as the number of baffles facilitate to impede the upstream and splash of molten metal 200, and is not limited to the configuration of FIG. 6(a).

FIG. 6(b) shows the front view of the baffle system 140 when viewing from Y direction. FIG. 6(b) shows the corresponding outer diameter L7 of the tube of the baffle system 140 and the inner diameter L6 of a circle of the contact surface between the tube of the baffle system 140 and the baffles 145, 147, 149, 151, and 153. In some embodiments, L6 and L7 are 0.25× and 0.5×, respectively, and x is a positive number. FIG. 6(b) shows that the tip of the largest lower baffle 153 as seen from the front view of the baffle system 140, however, they are not the first ones catching the incoming liquid droplets 20 and would not apply a strong impedance to the incoming flow of the liquid droplets 20. In FIG. 6(b), the baffle e.g. 153 shows a shape having same thickness from the left end to the right end, in some embodiments of the present disclosure. In other embodiments, in the front view of the baffle system 140, the baffles can have a crescent shape (not shown) having minimum thickness at both left and right ends, and maximum thickness at the central region. In other embodiments, in the front view of the baffle system 140, the baffles can have a shape of a semicircle without completely blocking the entrance of the liquid droplets 20. In FIGS. 6(a) and 6(b), the surface of the baffles of the baffle system 140 are smoothened for the molten metal 200 to flow back to the bottom of the metal droplet catcher 100, in some embodiments of the present disclosure. In other embodiments, the surface of the baffles of the baffle system 140 is made to have a certain roughness with increased surface area so as to catch the upstream splash of the molten metal 200.

FIG. 7(a) shows a baffle system 140 having baffles 145, 146, 147, 148, 149, 150, 151, 152, 153, 154, and 155. The baffles 145, 146, 147, 148, 149, 150, 151, 152, 153, 154, and 155 are arranged along a length direction (Y direction in FIGS. 4(a) and 4(b)) of the metal droplet catcher 100. All the baffles 145, 146, 147, 148, 149, 150, 151, 152, 153, 154, and 155 have the same length in some embodiments. In other embodiments, the baffles located closer to the inlet has a smaller length. The baffle system 140 has a tube length L4 the same as that of FIG. 5(a) and a distance of L5 between the tips of the longest upper baffle 154 and the longest lower baffles 153. In some embodiments, L4 and L5 are x and 0.125×, respectively, where x is a positive number and is the same as the above mentioned x. Each of the baffles 145, 146, 147, 148, 149, 150, 151, 152, 153, and 154 extends in an inclined direction toward a deeper region of the metal droplet catcher 100 (not shown), making an angle θ(in a range of 5 degrees to 85 degrees) with the extension direction of the tube wall TW of the baffle system 140, in some embodiments of the present disclosure. The baffles 145, 146, 147, 148, 149, 150, 151, 152, 153, and 154 have the lengths L8, L9, L8', L9', L8", L9", L8''', L9''', L8'''', and L9'''', respectively. In FIG. 7(a), the upper baffles 146, 148, 150, 152, and 154 have the same lengths without a baffle being the longest one, i.e. L9=L9'=L9"=L9'''=L9'''', in some embodiments of the present disclosure. In other embodiments, L9≤L9'≤L9"≤L9'''≤L9'''', and in certain embodiments, L9<L9'<L9"<L9'''<L9''''. Also, in FIG. 7(a), the lower baffles 145, 147, 149, 151, and 153 have the same lengths without a baffle being the longest one, i.e. L8=L8'=L8"=L8'''=L8'''', in some embodiments of the present disclosure. In other embodiments, L8≤L8'≤L8"≤L8'''≤L8'''', and in certain embodiments, L8<L8'<L8"<L8'''<L8''''. In this way, the first baffle 145 catching the droplet 20 is not the largest one and does not apply the largest area to impede the flow of the droplet 20. In this system, no baffle is the largest and this efficiently allows the incoming flow of the liquid droplets 20. In some embodiments, the number of lower baffles can be 5, i.e. 145, 147, 149, 151, and 153, and the number of lower baffles can be any number as long as the number of baffles facilitate to impede the upstream and splash of molten metal 200, and is not limited to the configuration of FIG. 7(a). In some embodiments, the number of upper baffles can be 5, i.e. 146, 148, 150, 152, and 154, and the number of upper baffles can be any number as long as the number of upper baffles facilitate to impede the upstream and splash of molten metal 200 and allow the efficient incoming stream of liquid droplet 20, and is not limited to the configuration of FIG. 7(a). In some embodiments, the number of lower baffles is different from that of the upper baffles. In some embodiments, the number of lower baffles is greater than that of the upper baffles.

FIG. 7(b) shows the front view of the baffle system 140 when viewing from Y direction. FIG. 7(b) shows the outer diameter L7 of the tube of the baffle system 140 and the inner diameter L6 of a circle of the contact surface between the tube of the baffle system 140 and the baffles 145, 146, 147, 148, 149, 150, 151, 152, 153, 154, and 155. In some embodiments, L6 and L7 are 0.25× and 0.5×, respectively, and x is a positive number. FIG. 7(b) shows that the tip of the first lower baffle 145 and the tip of the first upper baffle 146 as seen from the front view of the baffle system 140, however, they are not the largest ones facing and catching the incoming liquid droplets 20 and would not apply a strong impedance to the incoming flow of the liquid droplets 20. In FIG. 7(b), the baffles e.g. 145 and 146 show a shape having same thickness from the left end to the right end, in some embodiments of the present disclosure. In other embodiments, in the front view of the baffle system 140, the baffles can have a crescent shape (not shown) having minimum thickness at both left and right ends, and maximum thickness at the central region. In other embodiments, in the front view of the baffle system 140, the baffles can have a shape of a semicircle without completely blocking the entrance of the liquid droplets 20. In FIGS. 7(a) and 7(b), the surface of the baffles of the baffle system 140 are smoothened for the molten metal 200 to flow back to the bottom of the metal droplet catcher 100, in some embodiments of the present disclosure. In other embodiments, the surface of the baffles of the baffle system 140 is made to have a certain roughness so as to provide increased surface area to catch the upstream of the molten metal 200.

FIGS. 8(a), 8(b), 9(a), 9(b), 10(a), 10(b), 11(a), and 11(b) show baffle system with the baffles 145' having a shape of a groove instead of a protrusion like FIGS. 5(a), 5(b), 6(a), 6(b), 7(a), and 7(b). Also, in FIGS. 8(a), 8(b), 9(a), 9(b), 10(a), 10(b), 11(a), and 11(b), the groove-form baffles e.g. 145', 147', etc. are formed in the lower portion of the baffle system 140 while the upper inner surface of the baffle system has no groove-form baffles or protrusion-type baffles.

FIG. 8(a) shows the baffle system 140 having no upper baffles and having only lower groove-form baffles 145', 147', 149', 151', 153', and 155'. The groove-form baffles 145', 147', 149', 151', 153', and 155' are arranged along a length direction (Y direction in FIGS. 4(a) and 4(b)) of the metal droplet catcher 100. The baffle system 140 has a tube length L4 the same as that in FIG. 5(a) and the corresponding distance L5 of FIG. 8(b) is now defined between the top of the groove-form baffle 155' and the upper tube inner wall TW. The baffle system 140 of FIG. 8(a) is a system having groove-form baffles 145', 147', 149', 151', 153', and 155' having the same depth. Each of the groove-form baffles 145', 147', 149', 151', 153', and 155' extends in an inclined direction to make an angle θ (in a range of 5 degrees to 85 degrees) the same as that in FIG. 5(a) with the extension direction of the tube wall TW of the baffle system 140, in some embodiments of the present disclosure. The groove-form baffles 145', 147', 149', 151', 153', and 155' have depths L8, L8', L8", L8'", L8"", and L8""', respectively. In FIG. 8(a), the upper inner tube wall TW can be smoothened to allow the flow of liquid droplets 20 into the tube and the deeper region of the metal droplet catcher 100 so as to become the collected molten metal 200. In FIG. 8(a), the lower groove-form baffles 145', 147', 149', 151', 153', and 155' have the same depths without a groove-form baffle being the deepest one, i.e. L8=L8'=L8"=L8'"=L8""=L8""'=d, in some embodiments of the present disclosure. In some embodiments, the number of lower groove-form baffles can be 6, i.e. 145', 147', 149', 151', 153', and 155', and the number of baffles can be any number as long as the number of groove-form baffles facilitate to impede the upstream and splash of molten metal 200, and is not limited to the configuration of FIG. 8(a).

FIG. 8(b) shows the front view of the baffle system 140 when viewing from Y direction. FIG. 8(b) shows that the groove-form baffles are not seen from the front view, and the effect of the groove-form baffles creates a roughness to encourage adherence of the upstream of the splashed collected molten metal 200. The energetic droplets of the splashed molten metal 200 would impact or contact the groove-form baffles 145', 147', 149', 151', 153', and 155' and the interior structure and surface of the groove-form baffles 145', 147', 149', 151', 153', and 155' impede the upstream flow of the collected molten metal 200 without impeding the incoming flow of the liquid droplets 20 into the metal droplet catcher 100. The groove-form baffles 145', 147', 149', 151', 153', and 155' can have a shape having same depth from the left end to the right end in the front view (not shown), in some embodiments of the present disclosure. In other embodiments, the groove-form baffles 145', 147', 149', 151', 153', and 155' can have a crescent groove shape (not shown) having minimum depths at both left and right ends, and maximum depth at the central region. In FIGS. 8(a) and 8(b), the interior surface of the groove-form baffles 145', 147', 149', 151', 153', and 155' of the baffle system 140 are smoothened for the metal droplets 200 to flow back to the bottom of the metal droplet catcher 100, in some embodiments of the present disclosure. In other embodiments, the surface of the groove-form baffles 145', 147', 149', 151', 153', and 155' of the baffle system 140 is made to have a certain roughness with increased surface area so as to catch the upstream of the molten metal 200.

FIG. 9(a) shows the baffle system 140 having no upper baffles and having only lower baffles 145', 147', 149', 151', 153', and 155'. The groove-form baffles 145', 147', 149', 151', 153', and 155' are arranged along a length direction (Y direction in FIGS. 4(a) and 4(b)) of the metal droplet catcher 100. The baffle system 140 has a tube length L4 the same as that in FIG. 5(a) and the corresponding distance of L5 is now defined between the top of the groove-form baffle 155' and the upper tube inner wall TW. The baffle system 140 of FIG. 9(a) is a system having groove-form baffles 145', 147', 149', 151', 153', and 155' having the different depths. Each of the groove-form baffles 145', 147', 149', 151', 153', and 155' extends in an inclined direction to make an angle θ (in a range of 5 degrees to 85 degrees) the same as that in FIG. 5(a) with the extension direction of the tube wall TW of the baffle system 140, in some embodiments of the present disclosure. The groove-form baffles 145', 147', 149', 151', 153', and 155' have depths L8, L8', L8", L8'", L8"", and L8""', respectively. In FIG. 9(a), the upper inner tube wall TW can be smoothened to allow the flow of liquid droplets 20 into the tube and the deeper region of the metal droplet catcher 100 so as to become the collected molten metal 200. In FIG. 9(a), the lower groove-form baffles 145', 147', 149', 151', 153', and 155' have the ascendingly increasing depths with the groove-form baffle 155' closest to the deeper region of the metal droplet catcher 100 being the deepest one, i.e. L8<L8'<L8"<L8'"<L8""<L8""'=d, in some embodiments of the present disclosure. In some embodiments, the number of lower groove-form baffles can be 6, i.e. 145', 147', 149', 151', 153', and 155', and the number of groove-form baffles can be any number as long as the number of groove-form baffles facilitate to impede the upstream and splash of molten metal 200, and is not limited to the configuration of FIG. 9(a).

FIG. 9(b) shows the front view of the baffle system 140 when viewing from Y direction. FIG. 9(b) shows that the groove-form baffles 145', 147', 149', 151', 153', and 155' are not seen from the front view, and the effect of the groove-form baffles creates a roughness to encourage adherence of the upstream of the splashed collected molten metal 200. The energetic droplets from the splashed molten metal 200 would impact or contact the groove-form baffles 145', 147', 149', 151', 153', and 155' and the interior structure and surface of the groove-form baffles 145', 147', 149', 151', 153', and 155' impede the upstream flow of the collected molten metal 200 without impeding the incoming flow of the liquid droplets 20 into the metal droplet catcher 100. The groove-form baffles 145', 147', 149', 151', 153', and 155' can have a shape having the same depth from the left end to the right end in the front view (not shown), in some embodiments of the present disclosure. In other embodiments, the groove-form baffles 145', 147', 149', 151', 153', and 155' can have a crescent groove shape (not shown) having minimum depths at both left and right ends, and maximum depth at the central region. In FIGS. 9(a) and 9(b), the interior surface of the groove-form baffles 145', 147', 149', 151', 153', and 155' of the baffle system 140 are smoothened for the molten metal 200 to flow back to the bottom of the metal droplet catcher 100, in some embodiments of the present disclosure. In other embodiments, the surface of the groove-form baffles 145', 147', 149', 151', 153', and 155' of the baffle system 140 is made to have a certain roughness with increased surface area so as to catch the upstream of the molten metal 200.

FIG. 10(a) shows the baffle system 140 having no upper baffles and having only lower groove-form baffles 145', 147', 149', 151', 153', and 155'. The groove-form baffles 145', 147', 149', 151', 153', and 155' are arranged along a length direction (Y direction in FIGS. 4(a) and 4(b)) of the metal droplet catcher 100. The baffle system 140 has a tube length L4 the same as that in FIG. 5(a) and the corresponding distance of L5 is now defined between the top of the groove-form baffle 155' and the upper tube inner wall TW. The baffle system 140 of FIG. 10(a) is a system having groove-form baffles 145', 147', 149', 151', 153', and 155' having the same depth. Each of the groove-form baffles 145', 147', 149', 151', 153', and 155' extends at right angle with respect to the extension direction of the tube wall TW of the baffle system 140, in some embodiments of the present disclosure. The groove-form baffles 145', 147', 149', 151', 153', and 155' have depths L8, L8', L8'', L8''', L8'''', and L8''''', respectively. In FIG. 10(a), the upper inner tube wall TW can be smoothened to allow the flow of liquid droplets 20 into the tube and the deeper region of the metal droplet catcher 100 so as to become the collected molten metal 200. In FIG. 10(a), the lower groove-form baffles 145', 147', 149', 151', 153', and 155' have the same depths without a groove-form baffle being the deepest one, i.e. L8=L8'=L8''=L8'''=L8''''=L8'''''=d, in some embodiments of the present disclosure. In some embodiments, the number of lower groove-form baffles can be 6, i.e. 145', 147', 149', 151', 153', and 155', and the number of baffles can be any number as long as the number of groove-form baffles facilitate to impede the upstream and splash of molten metal 200, and is not limited to the configuration of FIG. 10(a).

FIG. 10(b) shows the front view of the baffle system 140 when viewing from Y direction. FIG. 10(b) shows that the groove-form baffles are not seen from the front view, and the effect of the groove-form baffles creates a roughness to encourage adherence of the upstream of the splashed collected molten metal 200. The energetic droplets of the splashed molten metal 200 would impact or contact the groove-form baffles 145', 147', 149', 151', 153', and 155' and the interior structure and surface of the groove-form baffles 145', 147', 149', 151', 153', and 155' impede the upstream flow of the collected molten metal 200 without impeding the incoming flow of the liquid droplets 20 into the metal droplet catcher 100. The groove-form baffles 145', 147', 149', 151', 153', and 155' can have a shape having same depth from the left end to the right end in the front view (not shown), in some embodiments of the present disclosure. In other embodiments, the groove-form baffles 145', 147', 149', 151', 153', and 155' can have a crescent groove shape (not shown) having minimum depths at both left and right ends, and maximum depth at the central region. In FIGS. 10(a) and 10(b), the interior surface of the groove-form baffles 145', 147', 149', 151', 153', and 155' of the baffle system 140 are smoothened for the molten metal 200 to flow back to the bottom of the metal droplet catcher 100, in some embodiments of the present disclosure. In other embodiments, the surface of the groove-form baffles 145', 147', 149', 151', 153', and 155' of the baffle system 140 is made to have a certain roughness with increased surface area so as to catch the upstream of molten metal 200.

FIG. 11(a) shows the baffle system 140 having no upper baffles and having only high-number (greater than e.g. 20 groove-form baffles) of lower baffles 145', 147', 149', 151', 153', 155', and so on. The groove-form baffles 145', 147', 149', 151', 153', 155', and so on are arranged along a length direction (Y direction in FIGS. 4(a) and 4(b)) of the metal droplet catcher 100. The baffle system 140 has a tube length L4 the same as that in FIG. 5(a) and the corresponding distance of L5 is now defined between the top of the groove-form baffle closest to the deeper region of the metal droplet catcher 100 and the upper tube inner wall TW. The baffle system 140 of FIG. 11(a) is a system having groove-form baffles 145', 147', 149', 151', 153', 155', and so on, having the different depths. Each of the groove-form baffles 145', 147', 149', 151', 153', 155', and so on extends in an inclined direction to make an angle θ (in a range of 5 degrees to 85 degrees) the same as that in FIG. 5(a) with the extension direction of the tube wall TW of the baffle system 140, in some embodiments of the present disclosure. The groove-form baffles 145', 147', 149', 151', 153', 155', and so on, have depths L8, L8', L8'', L8''', L8'''', L8''''', and so on, respectively. In FIG. 11(a), the upper inner tube wall TW can be smoothened to allow the flow of liquid droplets 20 into the tube and the deeper region of the metal droplet catcher 100 so as to become the collected molten metal 200. In FIG. 11(a), the lower groove-form baffles 145', 147', 149', 151', 153', 155', and so on, have the ascendingly increasing depths with the groove-form baffle closest to the deeper region of the metal droplet catcher 100 being the deepest one, i.e. L8<L8'<L8''<L8'''<L8''''<L8'''''< . . . <depth of the groove form baffle closest to a deeper region of the metal droplet catcher 100=' d, in some embodiments of the present disclosure. In some embodiments, the number of lower groove-form baffles can be 25, i.e. 145', 147', 149', 151', 153', 155', . . . and 193', and the number of groove-form baffles can be any number as long as the number of groove-form baffles facilitate to impede the upstream and splash of molten metal 200, and is not limited to the configuration of FIG. 11(a).

FIG. 11(b) shows the front view of the baffle system 140 when viewing from Y direction. FIG. 11(b) shows that the groove-form baffles 145', 147', 149', 151', 153', 155', and so on, are not seen from the front view, and the effect of the groove-form baffles creates a roughness to encourage adherence of the upstream of the splashed collected molten metal 200. The energetic droplets from the splashed molten metal 200 would impact or contact the groove-form baffles 145', 147', 149', 151', 153', 155', and so on, and the interior structure and surface of the groove-form baffles 145', 147', 149', 151', 153', 155', and so on, impede the upstream flow of the collected molten metal 200 without impeding the incoming flow of the liquid droplets 20 into the metal droplet catcher 100. The groove-form baffles 145', 147', 149', 151', 153', 155', and so on, can have a shape having the same depth from the left end to the right end in the front view (not shown), in some embodiments of the present disclosure. In other embodiments, the groove-form baffles 145', 147', 149', 151', 153', 155', and so on, can have a crescent groove shape (not shown) having minimum depths at both left and right ends, and maximum depth at the central region. In FIGS. 11(a) and 11(b), the interior surface of the groove-form baffles 145', 147', 149', 151', 153', 155', and so on, of the baffle system 140 are smoothened for the molten metal 200 to flow back to the bottom of the metal droplet catcher 100, in some embodiments of the present disclosure. In other embodiments, the surface of the groove-form baffles 145', 147', 149', 151', 153', 155', and so on, of the baffle system 140 is made to have a certain roughness with increased surface area so as to catch the upstream of the molten metal 200.

It is understood to one of ordinary skill in the art that, the above mentioned embodiments can be oriented in horizontal, vertical, or tilted orientation. Also, in some embodiments, the metal droplet catcher 100 includes a heater 400 (see FIGS. 4(a) and 4(b)) to apply thermal energy to the metal droplet catcher 100 so as to assist the molten metal 200 collected on the inner surfaces to flow back to the rear portion of the metal droplet catcher 100.

It will be understood that not all advantages have been necessarily discussed herein, no particular advantage is required for all embodiments or examples, and other embodiments or examples may offer different advantages.

According to some embodiments of the present disclosure, an extreme ultraviolet (EUV) lithography system is disclosed. The system includes an EUV source to generate EUV radiation. The EUV source includes the following items. A laser and a target material droplet generator. A mask stage configured to secure an EUV mask. A wafer stage configured to secure a semiconductor wafer. An optical system designed to direct the EUV radiation from the EUV source to image a pattern defined on the EUV mask to the semiconductor wafer. The EUV source further includes a metal droplet catcher to receive metal droplets generated from the target material droplet generator. The metal droplet catcher includes baffles arranged along a length direction of the metal droplet catcher. The baffles make an acute angle with an inner surface of the metal droplet catcher. In an embodiment, the metal droplet catcher does not include a baffle on an inner surface of the metal droplet catcher. In another embodiment, the metal droplet catcher includes at least one baffle on a surface of the metal droplet catcher opposite to the arranged baffles along the length direction of the metal droplet catcher. In an embodiment, the metal droplet catcher has a closed bottom. In another embodiment, the metal droplet catcher has an open bottom. The open bottom leads to a tube connecting with the target material droplet generator. The metal droplets include tin droplets. The metal droplet catcher includes a heater to heat the metal droplet catcher. In a front view of an opening of the metal droplet catcher, the baffles have the same thickness from left to right.

According to some embodiments of the present disclosure, a droplet catcher is disclosed, The droplet catcher includes a tube main body and baffles arranged along a length direction of the tube main body. The baffles make an acute angle with an inner tube surface of the tube main body. The baffles are arranged on a portion of an inner tube surface of the tube main body and the remaining portion of the inner tube surface does not have a baffle. In another embodiment, the baffles are arranged on opposite portions of an inner tube surface of the tube main body. In an embodiment, the baffles have different lengths. The baffles have ascendingly increasing lengths. In another embodiment, the baffles have the same length. In an embodiment, the baffles have the same thickness from left to right when viewed from a front direction facing an opening of the tube main body. The baffles have smoothened surface.

According to some method embodiments of the present disclosure, an extreme ultraviolet (EUV) lithography system is disclosed. The system includes an EUV source to generate EUV radiation. The EUV source includes a laser and a target material droplet generator. The mask stage configured to secure an EUV mask. The system also includes a wafer stage configured to secure a semiconductor wafer. The system also includes an optical system designed to direct the EUV radiation from the EUV source to image a pattern defined on the EUV mask to the semiconductor wafer. The EUV source further includes a metal droplet catcher to receive metal droplets generated from the target material droplet generator. The metal droplet catcher includes a baffle system including groove-form baffles formed on inner wall of the baffle system.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) lithography system, comprising:
    an EUV source to generate EUV radiation, wherein the EUV source includes a laser and a target material droplet generator;
    a mask stage configured to secure an EUV mask;
    a wafer stage configured to secure a semiconductor wafer; and
    an optical system designed to direct the EUV radiation from the EUV source to image a pattern defined on the EUV mask to the semiconductor wafer,
    wherein the EUV source further includes a metal droplet catcher that comprises a first end to receive metal droplets generated from the target material droplet generator and a second end opposite to the first end, and
    wherein the metal droplet catcher includes a baffle system including groove-form baffles formed on an inner wall of the baffle system along a length of the metal droplet catcher from the first end to the second end, and
    wherein a depth of the groove-form baffles gradually increases along the length of the metal droplet catcher.

2. The EUV lithography system of claim 1, wherein the groove-form baffles are arranged on a first side of the inner wall of the baffle system, and wherein a second side of the inner wall of the baffle system opposite to the first side of the inner wall of the baffle system does not have a groove-form baffle.

3. The EUV lithography system of claim 1, wherein the groove-form baffles extends in an inclined direction to make an acute angle with the inner wall of the baffle system.

4. The EUV lithography system of claim 3, wherein the acute angle is between 40 degrees and 70 degrees.

5. The EUV lithography system of claim 1, wherein the second end of the metal droplet catcher is closed.

6. The EUV lithography system of claim 1, wherein the second end of the metal droplet catcher is open.

7. A metal droplet catcher, comprising:
    a tube main body that comprises a first end for receiving metal droplets and a second end opposite to the first end; and
    baffles arranged on a portion of an inner surface of the tube main body along a length of the tube main body from the first end to the second end, wherein the baffles are groove-form baffles, and wherein a depth of the groove-form baffles gradually increases along the length of the tube main body.

8. The metal droplet catcher of claim 7, wherein the second end of the tube main body is either:

open and leads to a tube connecting to a target material droplet generator, or the second end of the tube main body is closed.

9. The metal droplet catcher of claim 7, wherein a cross section of the groove-form baffles perpendicular to the length of the tube main body has a curve form.

10. The metal droplet catcher of claim 7, wherein the metal droplets comprise tin droplets.

11. The metal droplet catcher of claim 7, wherein the metal droplet catcher comprises a heater to heat the metal droplet catcher.

12. A metal droplet catcher tube, comprising:

a main body that comprises a first end for receiving metal droplets and a second end opposite to the first end; and baffles arranged on a portion of an inner surface of the main body along a length of the main body from the first end to the second end, wherein the baffles are groove-form baffles, and wherein a depth of the groove-form baffles gradually increases along the length of the main body.

13. The metal droplet catcher tube of claim 12, wherein a remaining portion of the inner surface of the main body does not have a baffle.

14. The metal droplet catcher tube of claim 12, wherein the groove-form baffles extends in an inclined direction to make an acute angle with the inner surface of the main body.

15. The metal droplet catcher tube of claim 14, wherein the acute angle with the inner surface of the main body is between 5 degrees and 85 degrees.

16. The metal droplet catcher tube of claim 14, wherein the inclined direction of each groove-form baffle makes a same acute angle with the inner surface of the main body.

17. The metal droplet catcher tube of claim 12, wherein the baffles are arranged on a first side of the inner surface of the main body.

18. The metal droplet catcher tube of claim 17, wherein a second side of the inner surface of the main body opposite to the first side does not have a baffle.

19. The metal droplet catcher tube of claim 18, wherein the second side of the inner surface of the main body is smoothened to allow a flow of metal droplets.

20. The metal droplet catcher tube of claim 12, wherein the second end of the main body is open.

* * * * *